US006407012B1

(12) United States Patent
Miyasaka et al.

(10) Patent No.: US 6,407,012 B1
(45) Date of Patent: Jun. 18, 2002

(54) METHOD OF PRODUCING SILICON OXIDE FILM, METHOD OF MANUFACTURING SEMICONDUCTOR DEVICE, SEMICONDUCTOR DEVICE, DISPLAY AND INFRARED IRRADIATING DEVICE

(75) Inventors: Mitsutoshi Miyasaka, Suwa; Takao Sakamoto, Amagagaki, both of (JP)

(73) Assignees: Seiko Epson Corporation; Mitsubishi Denki Kabushiki Kaisha, both of Tokyo (JP)

( * ) Notice: Subject to any disclaimer, the term of this patent is extended or adjusted under 35 U.S.C. 154(b) by 0 days.

(21) Appl. No.: 09/380,091

(22) PCT Filed: Dec. 25, 1998

(86) PCT No.: PCT/JP98/05991

§ 371 (c)(1),
(2), (4) Date: Aug. 25, 1999

(87) PCT Pub. No.: WO99/34431

PCT Pub. Date: Jul. 8, 1999

(30) Foreign Application Priority Data

Dec. 26, 1997 (JP) .............................. 9-361567

(51) Int. Cl.[7] ........................ H01L 21/31; H01L 21/469
(52) U.S. Cl. ...................................... 438/788; 438/789
(58) Field of Search ................................ 438/788, 789, 438/795, 787

(56) References Cited

U.S. PATENT DOCUMENTS 5,028,102 A * 7/1991 Ogura et al. ............... 350/3.62
6,066,516 A * 5/2000 Miyasaka ................... 438/149
6,071,765 A * 6/2000 Noguchi et al. ............ 438/166

FOREIGN PATENT DOCUMENTS

| JP | A-56-114333 | | 9/1981 |
| JP | A-58-215054 | | 12/1983 |
| JP | A-62-92329 | | 4/1987 |
| JP | A-63-110735 | | 5/1988 |
| JP | A-7-30114 | | 1/1995 |
| JP | A-8-78688 | | 3/1996 |
| JP | 08-153784 | | 6/1996 |
| JP | 09116160 | * | 2/1997 |
| JP | A-9-116160 | | 5/1997 |
| JP | A-9-129573 | | 5/1997 |

OTHER PUBLICATIONS

Laser –stimulated local change of glass ceramic optical properties, Skiba et al.*
Skiba, Petr A. et al., "laser–Simulated Local Change of Glass–Ceramic Optical Properties," Optical Engineering, vol. 33, No. 11, 1994, pp. 3572–3577.

* cited by examiner

Primary Examiner—Alexander G. Ghyka
(74) Attorney, Agent, or Firm—Oliff & Berridge, PLC

(57) ABSTRACT

The method for manufacturing a silicon oxide film is characterized in that the method includes the steps of forming the silicon oxide film by a vapor deposition method or the like and of irradiating infrared light onto this silicon oxide film. Thus, according to the present invention, a silicon oxide film of relatively low quality formed at relatively low temperature can be improved to be a silicon oxide film of high quality. When the present invention is applied to a thin-film semiconductor device, a semiconductor device of high operational reliability and high performance can be manufactured.

26 Claims, 12 Drawing Sheets

| WAVE LENGTH ($\mu$m) | WAVE NUMBER ($cm^{-1}$) | WAVE LENGTH ($\mu$m) | WAVE NUMBER ($cm^{-1}$) | WAVE LENGTH ($\mu$m) | WAVE NUMBER ($cm^{-1}$) | WAVE LENGTH ($\mu$m) | WAVE NUMBER ($cm^{-1}$) |
|---|---|---|---|---|---|---|---|
| 9.1265 | 1095.71 | 9.4285 | 1060.61 | 10.0585 | 994.18 | 10.4410 | 957.76 |
| 9.130 | 1094.81 | 9.4425 | 1059.04 | 10.0670 | 993.34 | 10.4585 | 956.16 |
| 9.1420 | 1093.85 | 9.4581 | 1057.29 | 10.0760 | 992.46 | 10.4765 | 954.52 |
| 9.1490 | 1093.02 | 9.4735 | 1055.58 | 10.0860 | 991.47 | 10.4945 | 952.88 |
| 9.1575 | 1092.00 | 9.4885 | 1053.91 | 10.0955 | 990.54 | 10.5135 | 951.16 |
| 9.1660 | 1090.99 | 9.5045 | 1052.13 | 10.1050 | 989.61 | 10.5236 | 950.25 |
| 9.1740 | 1090.04 | 9.5195 | 1050.48 | 10.1150 | 988.63 | 10.5518 | 947.71 |
| 9.1830 | 1088.97 | 9.5360 | 1048.66 | 10.1260 | 987.56 | 10.5713 | 945.96 |
| 9.1920 | 1087.90 | 9.5525 | 1046.85 | 10.1370 | 986.49 | 10.5912 | 944.18 |
| 9.2010 | 1086.84 | 9.5690 | 1045.04 | 10.1480 | 985.42 | 10.6118 | 942.35 |
| 9.2103 | 1085.74 | 9.5860 | 1043.19 | 10.1590 | 984.35 | 10.6324 | 940.52 |
| 9.2197 | 1084.63 | 9.6035 | 1041.29 | 10.1710 | 983.19 | 10.6534 | 938.67 |
| 9.2295 | 1083.48 | 9.5210 | 1050.31 | 10.1825 | 982.08 | 10.6748 | 936.79 |
| 9.2397 | 1082.29 | 9.6391 | 1037.44 | 10.1950 | 980.87 | 10.6965 | 934.89 |
| 9.2500 | 1081.08 | 9.6575 | 1035.46 | 10.2075 | 979.67 | 10.7194 | 932.89 |
| 9.2605 | 1079.86 | 9.6760 | 1033.48 | 10.2200 | 978.47 | 10.7415 | 930.97 |
| 9.2715 | 1078.57 | 9.6941 | 1031.56 | 10.2335 | 977.18 | 10.7648 | 928.95 |
| 9.2825 | 1077.30 | 9.7140 | 1029.44 | 10.2470 | 975.90 | 10.7880 | 926.96 |
| 9.2937 | 1076.00 | 9.7335 | 1027.38 | 10.2605 | 974.61 | 10.8120 | 924.90 |
| 9.3055 | 1074.63 | 9.7535 | 1025.27 | 10.2855 | 972.24 | 10.8360 | 922.85 |
| 9.3172 | 1073.28 | 9.7735 | 1023.17 | 10.2860 | 972.20 | 10.8605 | 920.77 |
| 9.3295 | 1071.87 | 9.7940 | 1021.03 | 10.3040 | 970.50 | 10.8855 | 918.65 |
| 9.3420 | 1070.43 | 9.8150 | 1018.85 | 10.3190 | 969.09 | 10.9110 | 916.51 |
| 9.3555 | 1068.89 | 9.8360 | 1016.67 | 10.3335 | 967.73 | 10.9360 | 914.41 |
| 9.3677 | 1067.50 | 9.8575 | 1014.46 | 10.3500 | 966.18 | 10.9630 | 912.16 |
|  |  | 9.8790 | 1012.25 | 10.3655 | 964.74 | 10.9900 | 909.92 |
|  |  | 9.9010 | 1010.00 |  |  | 11.0165 | 907.73 |
|  |  | 9.9230 | 1007.76 |  |  |  |  |
|  |  | 9.9465 | 1005.38 |  |  |  |  |

FIG. 14

METHOD OF PRODUCING SILICON OXIDE FILM, METHOD OF MANUFACTURING SEMICONDUCTOR DEVICE, SEMICONDUCTOR DEVICE, DISPLAY AND INFRARED IRRADIATING DEVICE

BACKGROUND OF THE INVENTION

1. Field of the Invention

The present invention relates to a method for manufacturing a silicon oxide film of good quality by a vapor deposition method. This silicon oxide film is suitable for an underlying layer-protecting film, a gate insulating film, an inter-layer insulating film, etc. The present invention also relates to a method for manufacturing a micro-semiconductor device of good quality (for example, metal/oxide film/semiconductor field effect transistor (MOSFET)) wherein a semiconductor surface is oxidized at a relatively low temperature of, e.g., about 800° C. or less and an extra-thin silicon oxide film (having less than about 10 nm in film thickness) of good quality is then formed. The present invention also relates to a method for manufacturing a semiconductor device (for instance, a thin film transistor) of high performance and reliability at a relatively low temperature such as around 600° C. or below. Moreover, the present invention relates to a semiconductor device of high performance and reliability manufactured thereby, and a display device (such as a liquid crystal display device) of high performance and reliability equipped with this semiconductor device. Furthermore, the present invention relates to an infrared light irradiating device for manufacturing a silicon oxide film of good quality.

2. Description of Related Art

Silicon oxide films are widely used for gate insulating films of polycrystalline silicon thin-film transistors (p-Si TFT) and gate insulating films of micro-semiconductor devices, such as VLSI having an extra-thin oxide film and the like, etc. The quality of these silicon oxide films has important effects on the electric characteristics of these semiconductor devices.

When a silicon oxide film is used for a gate insulating film of low temperature p-Si TFT, it is necessary to form a silicon oxide film at a relatively low temperature such as around 600° C. or below at which a general glass substrate can be used. Thus, a chemical vapor deposition method (CVD method) and a physical vapor deposition method (PVD method) have been conventionally applied.

Moreover, in manufacturing a micro-semiconductor device such as VLSI having an ultra thin oxide film, an ultra-thin silicon oxide film is provided by thermally oxidizing silicon at a relatively low temperature of e.g., 800° C. or below under an atmosphere containing oxygen and hydrochloric acid, or by irradiating a silicon substrate with oxygen plasma, etc.

However, these conventional silicon oxide films have a problem in that the film quality is extremely low since electric charge trapped in oxide films is large, and the like.

As a result, if a conventional silicon oxide film is used as a gate insulating film of p-Si TFT, there is a problem in that only a p-Si TFT of low quality and reliability can be provided. This is because it is easy to vary flat band voltage (Vfb) of a semiconductor device since silicon oxide films have a large amount of fixed electric charge of an oxide film, to enlarge threshold voltage (Vth) since a surface trapping level is high, and to introduce electric charge into oxide films since an oxide film trapping level is large, etc. In other words, conventional semiconductor devices such as p-Si TFT have many problems because the quality of silicon oxide films is low.

The same problems are found in a micro-semiconductor device such as VLSI with an ultra-thin silicon oxide film. Ultra-thin silicon oxide films are generally formed at a relatively low temperature of around 800° C. or below, so that they have all the problems of low temperature oxidation. More specifically, the problems are that a surface level and an oxide film trapping level are extremely high and the current of an oxide film is large. These problems are the main causes in limiting the properties of a superintegrated circuit and shortening its life.

SUMMARY OF THE INVENTION

Thus, the present invention solves the above-mentioned problems, and its objectives are to present a method for manufacturing a silicon oxide film of high quality by a vapor deposition method, to present a method for manufacturing a micro-semiconductor device such as VLSI having an ultra-thin oxide film of high quality by applying a silicon oxide film formed at a relatively low temperature such as about 800° C. or below, to present a method for manufacturing a semiconductor device (for instance, a thin film transistor) of high performance and reliability at a relatively low temperature of e.g., 600° C. or below, to present such a semiconductor device of high performance and reliability and a display device, and to present a device for manufacturing a silicon oxide film of high quality.

The present invention, first as a step of forming a silicon oxide film, deposits a silicon oxide film on various substrates such as an insulating substrate (for example, quartz glass substrate, popular non-alkali glass substrate, and the like), a semiconductor substrate (for instance, monocrystalline silicon substrate, compound semiconductor substrate, etc.) and a metal substrate by a vapor deposition method (for instance, chemical vapor deposition method (CVD) method), physical vapor deposition method (PVD method), and the like). A silicon oxide film is also formed by the oxidation of a semiconducting material surface such as by heat treatment (thermal oxidization) of a semiconducting material surface under an oxidizing atmosphere, the plasma irradiation (plasma oxidization) of an oxide material (such as oxygen and dinitrogen monoxide) to a semiconducting material surface, the supply of ozone($O_3$) (ozone oxidization), the supply of active oxygen (active oxygen oxidization) generated by a heated metal catalyst, or the like.

In the step of forming a silicon oxide film, a silicon oxide film is formed directly on a semiconductor substrate or a glass substrate as a field oxide film, a gate insulating film, an inter-layer insulating film, an underlying layer-protecting film, or the like. Furthermore, a silicon oxide film is formed on a semiconductor film, which is a pure silicon or the semiconductor having silicon as a main substance. This semiconductor film is formed in the step of forming a semiconductor film on an insulating material such as an oxide film formed on the surface of a glass substrate or a monocrystalline silicon substrate.

The semiconductor film having silicon as a main substance contains a mixture of silicon and other elements such as germanium in the film, and contains silicon at about 80% or above in percentage. Also, the pure silicon semiconductor films include silicon semiconductor films containing impurities such as P, B, Al, As and the like. Therefore, the silicon oxide films in the present invention mean not only pure silicon oxide films (SiOx films wherein x is roughly 2) but also silicon oxide films containing these elements and the oxides thereof. Silicon materials are in a monocrystalline state, polycrystalline state, amorphous state, mixed crystal state that is polycrystalline and amorphous, and the like.

The oxide film deposition step by a vapor deposition method is carried out at a relatively low temperature, around 600° C. or below. A PVD method contains a sputtering method, evaporation method, and the like. Also, a CVD method can contain an atmospheric pressure chemical vapor deposition method (APCVD method), low pressure chemical vapor deposition method (LPCVD method), plasma chemical vapor deposition method (PECVD method), and the like.

The step of forming an oxide film by thermal oxidation is carried out by treating a semiconducting material in the temperature range from around 600 to 1,000° C. under an oxidizing atmosphere containing oxygen, water vapor, hydrochloric acid, etc. In forming an ultra-thin oxide film at less than about 10 nm in film thickness, thermal oxidation is often carried out under the temperature around 800° C. or below. Also, in the step of forming an oxide film by plasma oxidation, ozone oxidation, active oxygen oxidation or the like, a semiconducting material is treated under the temperature of about 600° C. or below. (In this specification, thermal oxidation, plasma oxidation, ozone oxidation and active oxygen oxidation at temperatures of around 800° C. or below is called the low temperature oxidation method hereinafter.) The silicon oxide film obtained by the low temperature oxidation method generally has low quality in comparison with a thick thermal oxide film (in thickness of around 50 nm or above) obtained at the temperature of around 1,100° C. or above.

Next, in the present invention, the quality of these silicon oxide films will be improved by the following infrared light irradiation step. In the infrared light irradiation step, infrared light is irradiated onto a silicon oxide film obtained by the above-noted vapor deposition method and an ultra-thin silicon oxide film obtained by the low temperature oxidation method. The irradiation infrared light is absorbed by the silicon oxide film, increasing the temperature of the oxide film. This temperature increase improves quality of the silicon oxide film itself and it's interface. The transmitted light intensity I of infrared light to the silicon oxide film is:

$$I=I_0 \exp(-k \cdot t),$$

where $I_0$ is incident light intensity, t (cm) is the thickness of the silicon oxide film, and k (cm$^{-1}$) is the absorption coefficient of infrared light by the silicon oxide film. When a substrate is made of a material having nearly the same optical characteristics as a silicon oxide film such as glass, or when a substrate has larger absorption coefficient of the irradiation infrared light than the silicon oxide film, irradiation infrared light is absorbed not only by a silicon oxide film but also by a substrate such as glass. Thus, if an absorption ratio at a silicon oxide film is too low, the temperature of the silicon oxide film will not effectively increase but rather infrared light will be absorbed mainly by a substrate, thereby damaging the substrate. In other words, the substrate will be cracked or warped. Therefore, the temperature increase by infrared light is expected to be large at the silicon oxide film and small at the substrate such as glass. The maximum film thickness of a silicon oxide film of the present invention is around 1 $\mu$m, while the substrates such as glass substrates normally have a thickness of about several hundred $\mu$m or above. Thus, when the absorption of infrared light by the silicon oxide film exceeds around 10% with respect to incident light, the absorption by the substrate will be less than around 90%. Because the thickness of the silicon oxide film and the substrate is different by several hundred times or above, the temperature increase of a substrate will be much lower than the temperature increase of the silicon oxide film. Since infrared light enters the substrate after being irradiated from the surface thereof and then passes through the oxide film, it is understood that the condition of $$k \cdot t > 0.1$$

reduces the transmission light from the silicon oxide film to about less than 90% in accordance with the formula above. When the substrate has an extremely smaller absorption coefficient of infrared light, like a monocrystalline silicon, than the absorption coefficient by the silicon oxide film, the possibility of damaging the substrate is reduced even if the absorption of infrared light by the silicon oxide film is small. In this case the condition of $$k \cdot t > 0.01 \text{ is available.}$$

As described herein, in order to improve film quality by irradiating infrared light onto the silicon oxide film, the silicon oxide film has to absorb infrared light. FIG. 1 shows the infrared light absorption spectrum of a silicon oxide film deposited by electron cyclotron resonance plasma enhanced chemical vapor deposition method (ECR-PECVD method). The left vertical line expresses Absorbance (a) of the oxide film, and the right vertical line indicates Absorption Coefficient k (cm$^{-1}$). The Absorbance (a) and Absorption Coefficient (k) satisfy the relation $$k = \ln(10) \cdot a / t,$$

where t (cm) is a thickness of the silicon oxide film. The horizontal line in FIG. 1 is the wave number (cm$^{-1}$) of infrared light and the wavelength ($\mu$m) of corresponding light.

A silicon oxide film generally possesses three absorption peaks for infrared light: these peaks are asymmetric bond stretching peak (ABS), symmetric bond stretching peak (SBS) and bond bending peak (BB). FIG. 1 shows the ABS peak at the wave number of around 1,057 cm$^{-1}$ (9.46 $\mu$m in wavelength) with the absorption coefficient of 27,260 cm$^{-1}$, the SBS peak at the wave number of around 815 cm$^{-1}$ (12.27 $\mu$m in wavelength) with the absorption coefficient of 2,290 cm$^{-1}$ and the BB peak at the wave number of about 457 cm$^{-1}$ (21.88 $\mu$m in wavelength) with the absorption coefficient of 8,090 cm$^{-1}$. The wavelength of irradiated infrared light can be adjusted to these three types of absorption peaks. Thus, the wavelength of infrared light can be between around 8.929 $\mu$m (1,120 cm$^{-1}$ in wave number) and about 10 $\mu$m (1,000 cm$^{-1}$ in wave number) to be absorbed at ABS; the wavelength of infrared light can be between around 11.364 $\mu$m (880 cm$^{-1}$ in wave number) and about 13.158 $\mu$m (760 cm$^{-1}$ in wave number) to be absorbed at SBS; and the wavelength of infrared light can be between around 19.231 $\mu$m (520 cm$^{-1}$ in wave number) and about 25 $\mu$m (400 cm$^{-1}$ in wave number) to be absorbed at BB.

Infrared light is most effectively absorbed at ABS having the largest absorption coefficient. Even the lowest quality silicon oxide film provided by a vapor deposition method has about 25,000 cm$^{-1}$ in absorption coefficients at ABS. Thus, in order to satisfy the above-noted condition between the absorption coefficient and oxide thickness for any silicon oxide films obtained by a vapor deposition method, the thickness of a silicon oxide film must be about 40 nm or above. Similarly, when a monocrystalline silicon substrate is oxidized at about 800° C. or below, the absorption coefficient by the oxide film is about 30,000 cm$^{-1}$ or above, so that it will be possible to improve film quality of the ultra-thin oxide film without damaging the substrate when the oxide thickness is about 3.3 nm at minimum or above.

The infrared light irradiated onto a silicon oxide film in the present invention should at least contain a light component to be absorbed by the silicon oxide film. Although the infrared light could contain other light component, which are not absorbed by the silicon oxide film, the ratio of non-absorbing component should preferably be as small as possible so as to reduce damage to a substrate and a semiconductor film. In other words, it is preferable that the infrared light irradiated to the silicon oxide film in the present invention contains a light component to be absorbed by the silicon oxide film as a main component.

Moreover, it is more preferable that the infrared light irradiated onto a silicon oxide film in the present invention particularly contains a light component that corresponds especially to asymmetrical bond stretching vibration of the silicon oxide film so as to be absorbed by the silicon oxide film. This is because such an infrared light has large absorption coefficient, and, thus, the infrared light effectively heats up the silicon oxide film. The infrared light may contain a light component that does not correspond to asymmetrical bond stretching vibration of the silicon oxide film. However, in this case it is preferable that the ratio of non-absorbing component is as small as possible with respect to the heating efficiency of a substrate. In other words, it is preferable that the infrared light irradiated onto the silicon oxide film in the present invention contains a light component, which corresponds to the asymmetrical bond stretching vibration of the silicon oxide film, as a main component.

In the above-described aspects, the infrared light irradiated to a silicon oxide film in the present invention preferably contains the light component of about 8.9 μm or above to around 10 μm or less in wavelength; and more preferably, it contains the light component of about 8.9 μm or above to around 10 μm or less in wavelength as a main component.

In order to satisfy such a requirement, the laser beams having a wavelength at about ABS of an oxide film may be irradiated as infrared light. Since the laser beams oscillate in a narrow wavelength range, it is possible to substantially reduce the light components which do not heat up a silicon oxide film but irradiate a substrate and a semiconductor. As such laser beams, the most excellent are carbon dioxide ($CO_2$) laser beams, and best among these are carbon dioxide ($CO_2$) laser beams of around 9.3 μm in wavelength. The carbon dioxide ($CO_2$) laser beams of around 9.3 μm in wavelength will be explained later.

The carbon dioxide laser beams have many oscillation lines in a waveband from 8.9 μm (1,124 cm$^{-1}$ in wave number) to 11 μm (909 cm$^{-1}$ in wave number) as represented by the wavelength of 9.3055±0.0005 μm (1,074.63±0.05 cm$^{-1}$ in wave number); and these wave numbers of light almost match ABS of the silicon oxide films obtained by a vapor deposition method or obtained at a relatively low temperature of about 800° C. FIG. 14 is a table showing the oscillation lines of a carbon dioxide laser beam which can be used in the present invention. The fluctuation of wavelength of each oscillation line is only 0.0005 μm and is only 0.05 cm$^{-1}$ in wave number. Among these oscillation lines, the oscillation line particularly suited for irradiated infrared light is the one which has the wavelength between about 9.2605±0.0005 μm (1,079.85±0.05 cm$^{-1}$ in wave number) and about 9.4885±0.0005 μm (1,053.91±0.05 cm$^{-1}$ in wave number), (these carbon dioxide laser beams are called carbon dioxide laser beams around the wavelength of 9.3 μm (1,075 cm$^{-1}$ in wave number)because this light is effectively absorbed by almost all the silicon oxide films).

As film quality declines, the location of ABS of a silicon oxide film shifts to the side of lower wave number. In fact, ABS peak of the silicon oxide film obtained by a vapor deposition method locates at a wave number of infrared light of between about 1,055 cm$^{-1}$ and about 1,070 cm$^{-1}$. This value almost matches the wave number of carbon dioxide laser beams around the wavelength of 9.3 μm (1,075 cm$^{-1}$ in wave number). In addition, the value of full width half maximum of ABS of such a low quality film is likely to increase, often reaching 100 cm$^{-1}$. Thus, even if ABS wave number slightly differs from the wave number of carbon dioxide laser around the wavelength of 9.3 μm, the silicon dioxide film can sufficiently absorb carbon dioxide laser beams. As oxide film quality improves by the irradiation of a carbon dioxide laser beam, the value of full width half maximum decreases. However, since ABS also shifts to the side of higher wave numbers, the oxide film can still absorb a carbon dioxide laser beam around 9.3 μm in wavelength efficiently. When a silicon oxide film is obtained by oxidizing a monocrystalline silicon substrate, the quality of an oxide film is high at the oxide temperature of about 1,100° C. or above, so that ABS is at around 1,081 cm$^{-1}$. Below about 1,100° C. of oxidation temperature, the location of ABS shifts to the side of lower wave numbers at the rate of about 2 cm$^{-1}$ as the oxidation temperature declines by 100° C., and will be at 1,075 cm$^{-1}$ in the oxidation at 800° C. This value matches the wave number of carbon dioxide laser beams of 9.3 μm in wavelength, and it is understood that a carbon dioxide laser beam at around 9.3 μm in wavelength is ideal as irradiated infrared light. An irradiated laser beam can be a simple oscillation of light having a wavelength at around 9.3 μm such as the wavelength of 9.3055±0.0005 μm, or can be a plurality of oscillations a plurality of light having wavelengths at around 9.3 μm.

It is preferable to carry out heat treatment for a long period at a high temperature in order to improve the quality of an oxide film by infrared light irradiation. According to an experiment, if a one-time infrared light irradiation period is less than about 0.1 seconds, the quality improvement of an oxide film will be noticeable after the temperature of an oxide film exceeds about 800° C. Thus, if infrared light irradiation is carried out so as to set the temperature of an oxide film at about 800° C. or above for a period of about 0.1 seconds, the quality of the oxide film will certainly improve. The correlation between the temperature and period necessary for improving the quality of an oxide film establishes the relation that the treatment period is shortened by a factor of ten as the oxide film temperature increases by 50° C. Thus, when any value of the oxide temperature over 800° C., which is due to the infrared light irradiation to the oxide, is expressed by $T_{ox}$ (° C.) and the total time that the oxide temperature is higher than $T_{ox}$ is expressed by τ (s), $T_{ox}$ and τ must satisfy the following equations in order to improve the oxide:

$$\tau > \exp(\ln(10) \cdot (b \cdot T_{ox} + 15)); \text{ and}$$

$$b = -0.02 (° C.^{-1}).$$

In other words, the quality of an oxide film will improve if infrared light is irradiated to the film under the condition where $T_{ox}$ satisfies the relations:

$$\tau > \exp(-0.04605 \cdot T_{ox} + 34.539). \tag{1}$$

As a result, oxide current decreases; breakdown voltage rises; fixed oxide charge, decrease; and density of oxide trap is reduced.

When a silicon oxide film is formed on a semiconducting material having silicon as a main substance, infrared light irradiation of the present invention can improve the quality of an oxide film as well as interface characteristics between the semiconductor and the insulating film. Right after the oxide is formed either by vapor deposition method or low temperature oxidation method, strong oxidation stress always remains at the interface between the semiconductor film and the oxide film. In the low temperature oxidation of a semiconductor (for instance, Si), an oxide film grows under this mechanism: oxidation reactants (for example, $O_2$) diffuse in an oxide film (for instance, $SiO_2$) to reach the interface between the oxide film and the semiconductor film, and then the reactants supply oxygen atoms(O) between the semiconductor atoms (e.g., between Si—Si), thus forming a new oxide film (for example, Si—O—Si). As a result, the interatomic distance of adjacent atoms in a semiconductor (for example, distance between Si—Si) becomes clearly different from the interatomic distance of a semiconductor in an oxide film with an oxygen atom in-between (for instance, distance between Si and Si in Si—O—Si). This difference in interatomic distances generates tensile stress in a semiconductor film and compressive stress in an oxide film. If oxidation temperature is sufficiently high (around 1,070° C. or above), an oxide film will have viscous flow and the stress generated by oxidation will be relaxed. However, if the oxidation temperature is below about 1,070° C., the stress relaxation time will become much longer, so that the stress generated by oxidation will not be relaxed and remains in both thin films with an interface there-between.

Similar matters occur when an oxide film is formed by a vapor deposition method. That is because, in an early stage of oxide film deposition, oxidation accelerating materials used for a vapor deposition method ($O_2$, $O_3$ or the like) enter between atoms of a semiconductor, forming an ultra-thin oxide film of about 0.5 nm to about 2.0 nm and then depositing an oxide film by the vapor deposition method onto the ultra-thin oxide film. As described above, the vapor deposition method is carried out under the temperature 600° C. or below, so that oxidation stress during the period of ultra-thin oxide film formation cannot be relaxed. Regardless of whether it is a monocrystalline film or a polycrystalline film, oxidation stress changes a lattice interval of the semiconductor atoms; therefore, trap states for electrons and holes are formed at the interface between the semiconductor film and the oxide film, thus reducing the mobility of free carriers (electrons in a conduction band and holes in a valence band) at a surface. In the present invention, oxidation stress at an interface between a semiconductor film and an oxide film is relaxed by raising the temperature of an oxide film locally by infrared light irradiation, thereby forming an interface of good quality.

There are suitable conditions for improving an interface by infrared light irradiation. FIG. 2 is a graph showing the relations between stress relaxation time (vertical line) and heat treatment temperature (horizontal line) calculated in accordance with Irene's theory of a silicon oxide film (E. A. Irene et al.: J. Electrochem. Soc. 129 (1982) 2594). For example, when heat treatment temperature is 1,230° C., the viscous flow of an oxide film occurs for a heat treatment period of about 0.1 seconds or longer and oxidation stress is released. Thus, for the quality improvement of an interface by infrared light irradiation, irradiation conditions are set in the area above the curve shown in FIG. 2 (in the area described as an "Effective area of infrared light irradiation" in FIG. 2). More specifically, using $T_{ox}$ as any value of oxide temperature over 1,000° C., which is due to the infrared light irradiation to the oxide, and ($\tau$(s)) as a total time period during which the oxide temperature is over $T_{ox}$, the infrared light should be irradiated so as to satisfy the following equations:

$$\tau > 2 \cdot (1+v) \cdot \eta/E; \text{ and}$$

$$\eta = \eta_0 \cdot \exp(\epsilon/(k \cdot (Tox+273.15))).$$

In other words, infrared light may be irradiated under the condition with $T_{ox}$, satisfying the relations, $$\tau > 2 \cdot (1+v) \cdot \eta_0 \cdot \exp(\epsilon/(k \cdot (T_{ox}+273.15)))/E \qquad (2)$$

where v is the Poisson's ratio of an oxide film; E is the Young's modulus thereof; $\eta$ is the viscosity thereof; $\eta_0$ is the pre-exponential factor of viscosity; $\epsilon$ is the activation energy of viscosity; k is Boltzmann's constant; and each has the following values respectively:

$$v=0.18;$$

$$E=6.6\times10^{11} \text{ dyn}\cdot\text{cm}^{-2};$$

$$\eta_0=9.549\times10^{-11} \text{ dyn}\cdot\text{s}\cdot\text{cm}^{-2};$$

$$\epsilon=6.12 \text{ eV; and}$$

$$k=8.617\times10^{-5} \text{ eV}\cdot\text{K}^{-1}.$$

In order to complete heat treatment by infrared light onto an oxide film without damaging a substrate and a semiconductor film, the time for heating the same point on the substrate is preferably less than about 0.1 seconds. This is because, based on the experience of rapid thermal annealing (RTA) method, such a problem will not occur by a short time treatment of less than 0.1 seconds, while a glass substrate will warp or break during a heating time of about one second at the temperature of around 800° C. or above. When $T_{ox}$ is about 1,230° C. or above, one irradiation can be set for shorter than 0.1 seconds. This condition, however, cannot be satisfied with one irradiation when $T_{ox}$ is around 1,230° C. or below. Therefore, in order to improve interface characteristics under the condition of infrared light irradiation at the $T_{ox}$ of around 1,230° C. or below, each irradiation must be set for shorter than around 0.1 seconds and this irradiation is repeated several times so as to let $\tau$ satisfy the above-mentioned inequality. In this sense, discontinuous oscillation with periodicity is more preferable than continuous oscillation.

The discontinuous oscillation of infrared light having periodicity is as shown in an elapsed time figure shown in FIG. 3. One period of infrared light consists of oscillation time ($t_{ON}$) and non-oscillation time ($t_{OFF}$). In order to minimize thermal distortions to materials other than an oxide film such as a semiconductor, it is required to nearly equalize the oscillation time to the non-oscillation time or to shorten the oscillation time to the non-oscillation time ($t_{ON} < t_{OFF}$). This is because heat will certainly be radiated since the oscillation time is shorter than the non-oscillation time. Furthermore, in view of productivity, it seems ideal if the oscillation period and the non-oscillation period are roughly the same.

One more matter requiring attention is the control of the maximum temperature of an oxide film during the infrared light irradiation. The maximum temperature must be lower than the melting point of a semiconducting material when the oxide film, such as a gate insulating film or an inter-layer insulating film, is formed on the semiconductor material and the infrared light is irradiated onto this oxide film. For instance, when the semiconductor material is intrinsic silicon or silicon containing a small amount of impurities (less than about 1% of impurity concentration), the melting point of silicon is about 1,414° C. Thus, the maximum achievable temperature of an oxide film during the infrared light irradiation is preferably below about 1,414° C. This is because as a semiconducting material melts, adverse phenomena will occur: the change in an impurity concentration in the semiconductor material, the increase in interface states due to the random reconstruction of the interface between the oxide and semiconductor films, or, as the worst case, the destruction of the semiconductor device due to the evaporation and drift of the semiconducting material. In order to avoid these phenomena so as to manufacture an excellent semiconductor device with stability, the maximum temperature of an oxide film is the melting point of a semiconducting material or below.

When a semiconducting material is in a polycrystalline or amorphous state, dangling bonds exist in the semiconductor, and it is preferable that these dangling bonds are terminated by atoms such as hydrogen (H) or fluorine (F). Dangling bonds form trap states for the electrons and electron holes at a deep level in a forbidden band-gap (near the center of the forbidden band-gap), and reduce the number of electrons at a conduction band and the number of holes at a valence band. At the same time, the dangling bonds scatter free carriers to reduce the mobility values of the carriers. As a result, dangling bonds have worse semiconductor characteristics. The temperature increase of an oxide film due to infrared light irradiation improves the quality of a silicon oxide film itself and an interface significantly; and at the same time, this temperature increase of the oxide film causes the heat conduction to a semiconductor material and could remove hydrogen or fluorine atoms which terminate dangling bonds. Thus, in order to prepare an excellent semiconductor device such as a solar battery with a high light transforming efficiency and a thin-film transistor for high speed operation at low voltage, it is preferable to carry out a step of terminating dangling bonds by hydrogen plasma irradiation or the like after infrared light irradiation. Due to this step, the number of dangling bonds generated by infrared light irradiation will be reduced; the number of free carriers will increase; and at the same time, the mobility values will increase.

In the infrared light irradiation in the present invention, the heating time period of the same point on an oxide film by one-time irradiation is short, preferably less than about 0.1 seconds. By such a short-time irradiation, not only will thermal damage to a substrate be prevented, but also the diffusion of vapor reactive to a semiconducting material such as oxygen through an oxide film from a vapor phase will be extremely small, so that the irradiation can be done in an air ambient. If the irradiation time is long, oxygen in the air will diffuse to an interface, so that there is a fear that a new low-temperature oxide will be formed during the cooling step of a semiconducting material. As a result, improved characteristics of the interface will deteriorate again. In this sense, the irradiation is preferably done in an inert gas such as nitrogen, helium and argon. Due to infrared light irradiation, the surface of a semiconducting material will be heated up to near the melting point, so that a noble gas such as helium and argon is more preferable as the irradiation atmosphere than nitrogen with nitriding capability. By doing this, there will be no limitation on the infrared light irradiation time as long as a substrate or semiconducting material is not damaged, and a good interface will be obtained. This irradiation atmosphere control will be especially important to an ultra-thin oxide film to which diffusion is easy.

The method of manufacturing a semiconductor device of the present invention especially improves the electric characteristics of a semiconductor device when the semiconductor device has the structure that a semiconductor film is a thin crystalline film of less than about 200 nm in thickness and is sandwiched between silicon oxide films. The semiconductor device having this structure has two interfaces— an interface between a semiconductor film and a top oxide film and an interface between a semiconductor film and a bottom oxide film. When the semiconductor film contains donors or acceptors to be used as wiring, both these interfaces will contribute to electric conduction. Also, when the semiconductor film is used as an active layer of a silicon-on-insulator (SOI) semiconductor device, the thin semiconductor film can be fully depleted, so that both interfaces impact upon electric characteristics. By the irradiation of infrared light to this structure, the top and bottom oxide films sandwiching the semiconductor film will be heated up by infrared light irradiation; as a result, the quality of both interfaces will be improved. Moreover, as the crystalline semiconductor film is polycrystalline, the semiconductor film will be naturally heated up by thermal conduction from the top and bottom oxide films and even a polycrystalline semiconductor film will be recrystallized. Due to this recrystallization, crystalline grains of the polycrystalline semiconductor film will become large and the number of defects in the semiconductor film will decrease, so that semiconductor characteristics will further improve.

As described above, the present invention can improve conventional silicon oxide films of low quality (silicon oxide films formed by vapor deposition method, ultra-thin oxide films obtained by low-temperature oxidation method) to films of good quality by adding the step of infrared light irradiation; and at the same time, the present invention can improve interface conditions between a semiconductor and an oxide film. Moreover, when a semiconductor film is sandwiched between a first oxide film and a second oxide film, both interfaces can be improved. Furthermore, when the semiconductor is a crystalline film, this crystal can also be improved. As a result, superior effects will be realized: the electric characteristic of a semiconductor device, represented by a thin-film transistor, will increase; and at the same time, the operational stability and reliability of the semiconductor device will be enhanced.

BRIEF DESCRIPTION OF THE DRAWINGS

FIG. 14 is a table showing an oscillation lines of carbon dioxide ($CO_2$) laser.

DETAILED DESCRIPTION OF THE PREFERRED EMBODIMENTS

Figure 1:
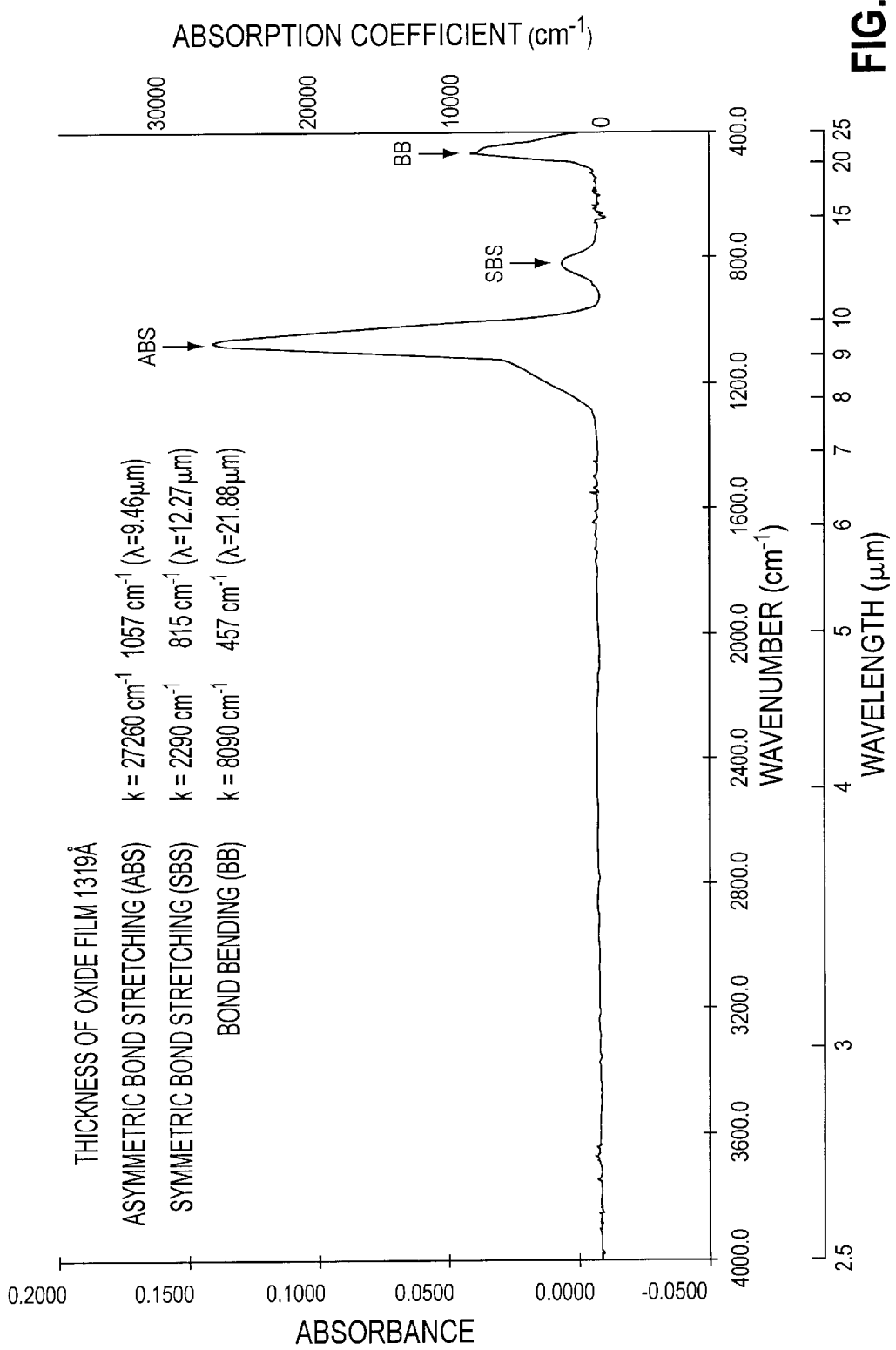
FIG. 1 is a figure showing the infrared light absorption characteristics of a silicon oxide film.

The semiconductor device of the present invention includes at least a semiconductor film formed on a first silicon oxide film as an insulating material and a second silicon oxide film formed on this semiconductor film. If it is a top-gate type semiconductor device, the first silicon oxide film corresponds to an underlying layer-protecting film and the second silicon oxide film corresponds to a gate insulating film. On the other hand, if it is a bottom-gate type semiconductor device, the first silicon oxide film corresponds to a gate insulating film and the second silicon oxide film corresponds to an inter-layer insulating film. Moreover, the display device of the present invention has such a semiconductor device.

A substrate is first prepared for fabricating these semiconductor and display devices. As the substrate, glass, monocrystalline silicon, and the like are generally used. Besides these, any type or size of substrates can be used if the substrates can resist high temperature during the manufacturing process of a semiconductor device and impurity contamination of impurities into a semiconductor film is sufficiently small.

First, the first silicon oxide film is formed on a substrate by a vapor deposition method or a low temperature oxidation method. If the substrate is highly pure quartz glass, a quartz glass substrate can also be regarded as the first silicon oxide film.

Next, a semiconductor film is formed on an insulating material where at least a surface in contact with the semiconductor film is the first silicon oxide film. In this step of forming a semiconductor film, a high energy body such as a laser beam or heat is supplied to this semiconductor film after film deposition by a vapor deposition method or the like, thus processing the melt crystallization or the solid phase crystallization of the semiconductor film. If the initially deposited thin film is amorphous or mixed crystal which is a mixture of amorphous and microcrystalline, this step is generally called crystallization. On the other hand, if the initially deposited thin film is polycrystalline, this step is normally called recrystallization. In this specification, both are called crystallization and are not distinguished from each other. The most excellent high energy bodies are the krypton fluorine (KrF) excimer laser and xenon chloride (XeCl) excimer laser. Due to the irradiation thereof, at least the surface of a semiconductor thin film is molten and crystallized. There is an excellent characteristic in that crystal grains inside a molten area rarely have defects by melt-crystallization. On the other hand, the control of the energy supplied during melt-crystallization is highly difficult: if the irradiation energy density of the excimer laser or the like onto the semiconductor thin film is slightly larger than an appropriate level, it is realized that the size of crystal grains of the polycrystalline film is suddenly reduced by the amount of between 1/10 to 1/100 and, in the worst case, the semiconductor film will disappear. Therefore, in the present invention, the melt-crystallization of a semiconductor film is carried out by setting an irradiation laser energy density lower than an appropriate level by about 5 mJ·cm$^{-2}$ to about 50 mJ·cm$^{-2}$. As a result, the melt-crystallization of a semiconductor film will be carried out with stability. Of course, the crystalline quality of the polycrystalline semiconductor film is not very high under this condition; however, there is a step of irradiating infrared light to the oxide film as the following step in the present invention.

In other words, on the crystalline semiconductor film obtained thereby, a second silicon oxide film is formed by a vapor deposition method or a low temperature oxidation method, and a light irradiating step where infrared light is irradiated to the second silicon oxide film after this step of forming the oxide film is then provided.

As a silicon oxide film is heated by infrared light irradiation, even the semiconductor film is heated at the temperature near a semiconductor melting temperature for a relatively long period of several μs to several ms. In the above-described melt crystallization, the semiconductor film is heated at the melting temperature for several dozen ns. In comparison to this, the semiconductor temperature during the light irradiation step is slightly lower. However, the heating process time extends a hundred to a million times, so that the crystallization of a semiconductor film that is insufficient only by melt-crystallization will be significantly improved in the light irradiation step. During the melt-crystallization step, crystal grains of high quality are formed only near the surface of a semiconductor film, and a large amount of micro-defects and amorphous components remain in the bottom section of the semiconductor film near the first oxide film. These residual components are crystallized from the crystal grains of good quality near the surface in the light irradiation step, and a crystallized film of good quality is then formed over the entire film thickness direction of the semiconductor film. As understood from such a principle, the semiconductor film being sandwiched between the first oxide film and the second oxide film means that the semiconductor film is heated from both top and bottom in the light irradiation step; as a result, uniform crystallization is promoted over the entire semiconductor film. Similar results found in the melt-crystallized film are found when the semiconductor film is crystallized in a solid phase. The solid phase crystallized film contains a large quantity of defects in crystal grains, but recrystallization is promoted in the light irradiation step of the present invention, thus reducing those in-grain defects.

A semiconductor film formed on any type of substrate certainly has a top interface and a bottom interface. When the semiconductor film is used as an electric conductor by adding impurities, a current path exists near both the interfaces of the top and bottom. Similarly, as the semiconductor film is applied as an active layer (channel formation region) of a field-effect semiconductor device, the semiconductor film as a whole contributes to electric conduction if the thickness of the active layer is less than about 150 nm, so that the quality of both interfaces provides direct effects on the quality in electric characteristics of the semiconductor device. In the present invention, a semiconductor film is sandwiched between a first oxide film and a second oxide film, and irradiated infrared light is selected so as to make the absorption coefficient of infrared light by the semiconductor film smaller than the absorption coefficient by the oxide film by several digits, so that both interfaces are heated to almost the same temperature and will be improved to have the same interface conditions of good quality. As a result, a semiconductor device with excellent electric characteristics is fabricated.

First Embodiment

Figure 4:
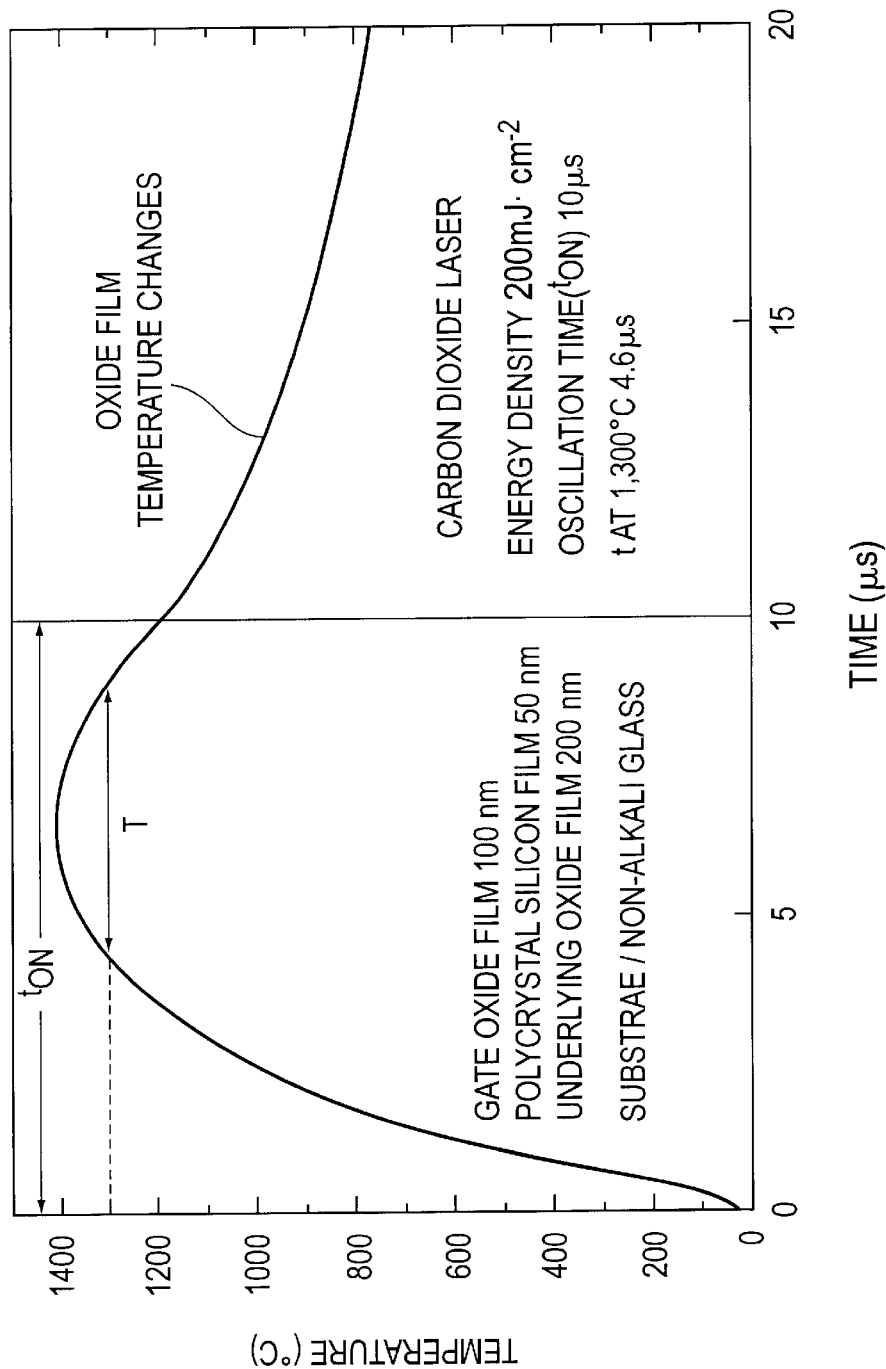
FIG. 4 is a figure showing the change in oxide film temperature by infrared light irradiation.
Figure 5A:
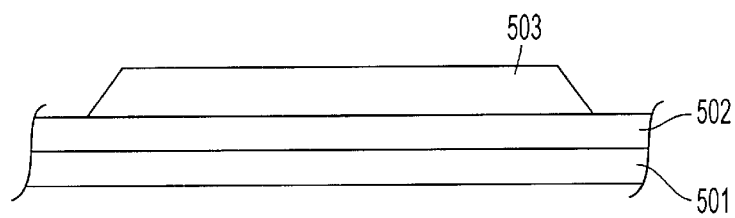
FIG. 5 shows figures explaining the method of manufacturing a semiconductor device of the present invention.
Figure 5B:
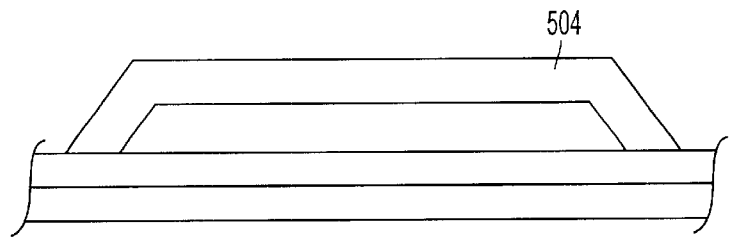
Figure 5C:
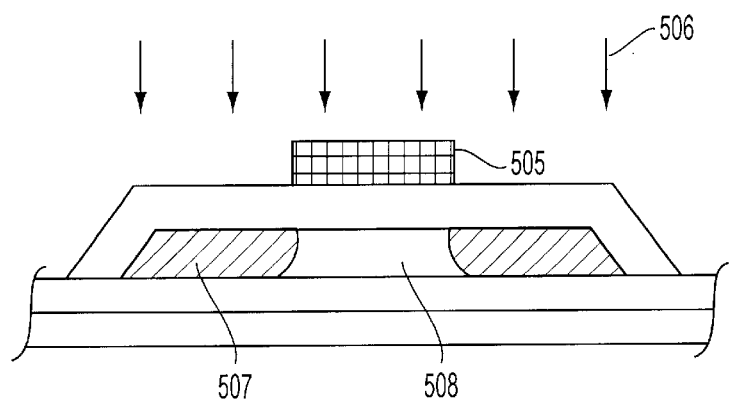
Figure 5D:
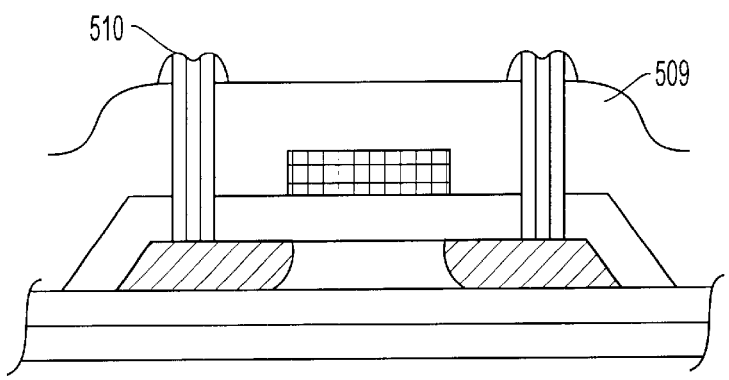

FIG. 4 is a figure showing the oxide film temperature changes by infrared light irradiation. As infrared light, a carbon dioxide laser beam was used and this infrared light was irradiated onto a silicon oxide film constituting a gate insulating film; temperature changes over the silicon oxide film were estimated by an electronic computer. The vertical line indicates the temperature of the silicon oxide film surface, and the horizontal line indicates the time right after irradiation has started. As a substrate, popular non-alkali glass is assumed. On a substrate, a silicon oxide film is deposited as an underlying layer-protecting film at the thickness of 200 nm by an ECR-PECVD method, and a polycrystalline silicon film with a thickness of 50 nm thereon and, moreover, a silicon oxide film as a gate insulating film with a thickness of 100 nm thereon are deposited by the ECR-PECVD method. The optical characteristics of the gate insulating film and the underlying layer-protecting film are the same as the ones shown in FIG. 1. A carbon dioxide laser is irradiated onto a sample having such a film structure from the surface side (in other words, the gate insulating film side) of the substrate. The wavelength of the carbon dioxide laser is assumed to be 9.3 $\mu$m (1,075 cm$^{-1}$ in wave number), and the absorption coefficient (k) of the silicon oxide film to this infrared light by the ECR-PECVD method is 26,200 cm$^{-1}$. Therefore, the product (k·t) of the absorption coefficient and the thickness of the gate oxide film is 0.262, and the ratio of transmitted light relative to incident light of the gate insulating film is 77%. The energy density of the carbon dioxide laser at the surface of the gate insulating film is supposed to be 200 mJ·cm$^{-2}$, and temperature change of the oxide film under the irradiation condition of 10 $\mu$s of the oscillation time ($t_{ON}$) thereof is calculated. However, single laser irradiation is assumed herein, so the non-oscillation time ($t_{OFF}$) is infinite.

According to the calculation results shown in FIG. 4, the time ($\tau_{1300}$) of oxide temperature at 1,300° C. or above is about 4.6 $\mu$s and, similarly, the time ($T_{900}$) of oxide temperature at 900° C. or above is about 13.1 $\mu$s. In order to improve the quality of the oxide film at 900° C., according to the formula (1), $\tau_{900}$ should be about 1 ms or above; therefore, it is considered that the total time above 900° C. should be longer than 1 ms as 13.1 $\mu$s×77=1.0087 ms by repeating this irradiation seventy-seven times. However, in reality, the time ($\tau_{1300}$) at the temperature of 1,300° C. or above is about 4.6 $\mu$s. According to the formula (1), in order to improve the quality of the oxide film at 1,300° C., the time is only about 1×10$^{-11}$s or longer. Thus, the quality of the oxide film is sufficiently improved by this one infrared light irradiation. As shown in this example, the formula (1) and (2) must be satisfied at any temperature so as to improve the quality of an oxide film and an interface.

Figure 2:
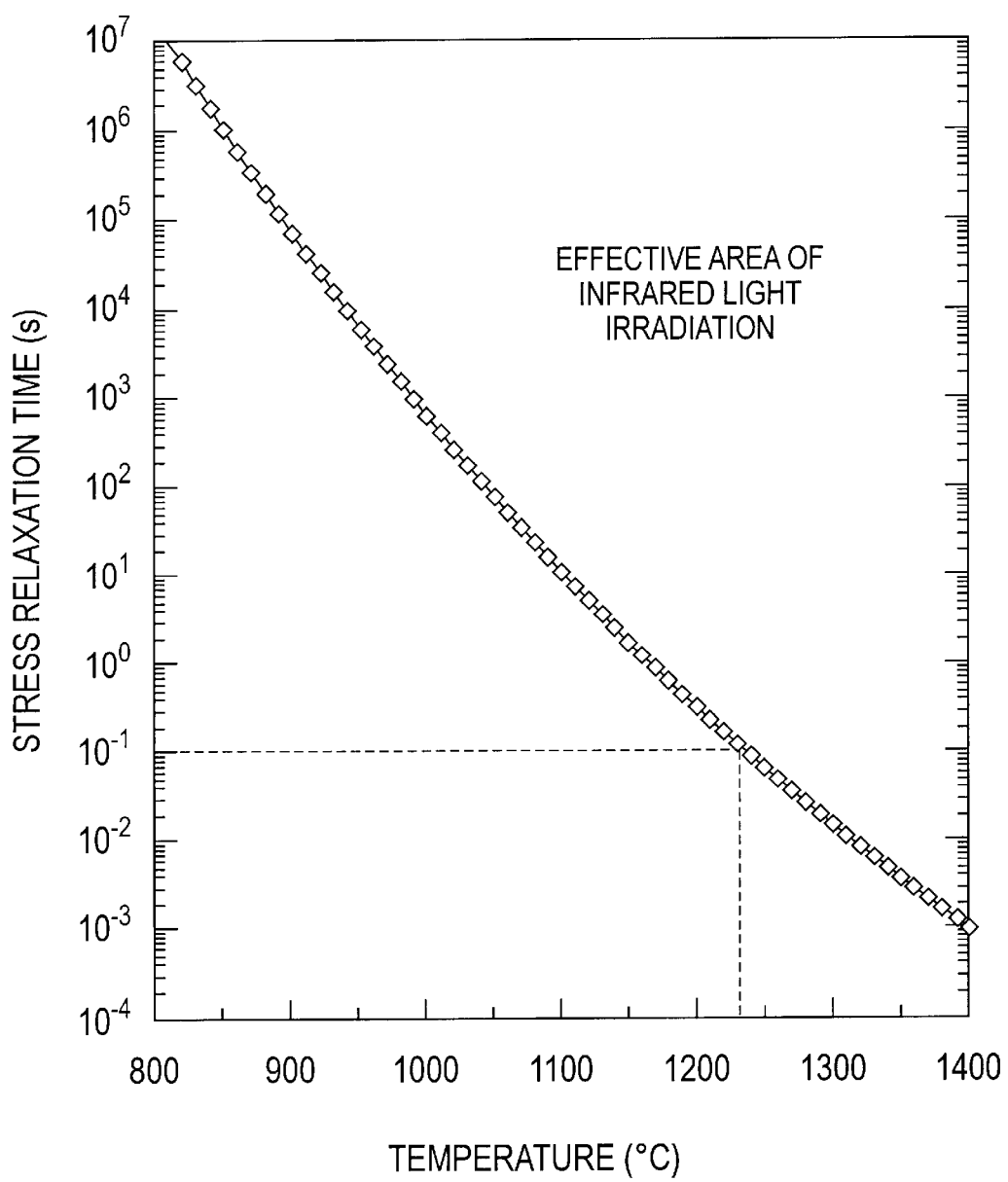
FIG. 2 is a figure showing the effective area of the present invention.
Figure 3:
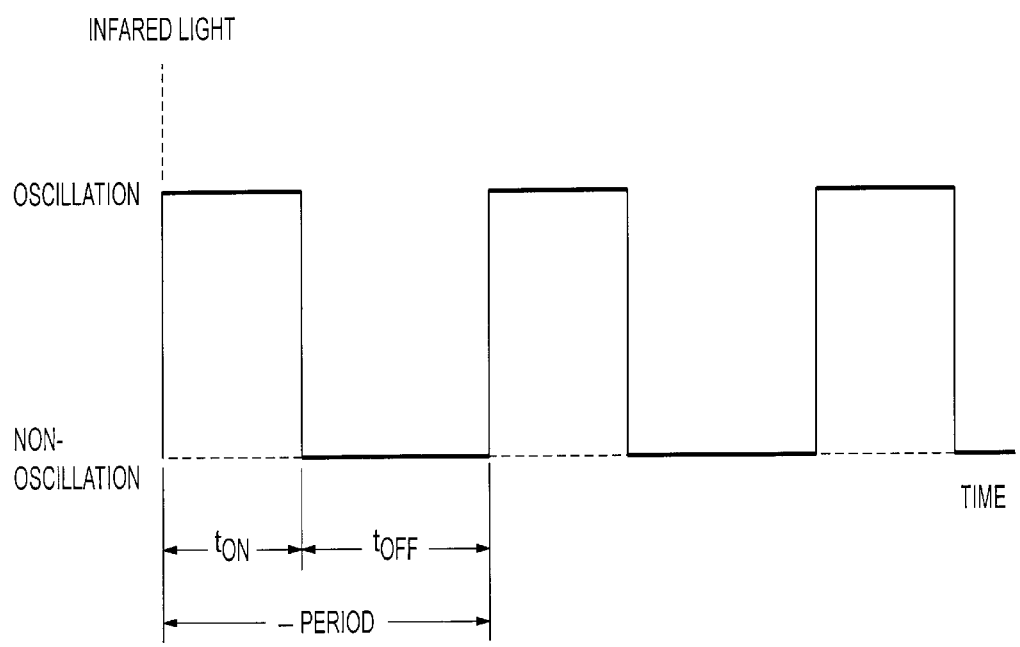
FIG. 3 is an elapsed time figure explaining infrared light oscillation.

In order to improve the quality of an interface between an oxide film and a semiconductor film under the conditions of FIG. 4, the total time of oxide temperature at 1,300° C. or above has to be about 13.8 ms or longer in accordance with the formula (2) and FIG. 2. On the other hand, $\tau_{1300}$ by one discontinuous oscillation irradiation is about 4.6 $\mu$s; thus, if the same irradiation is repeated by around 3,000 times or more, 4.6 $\mu$s×3,000=13.8 ms and the total time at 1,300° C. or above can be about 13.8 ms or longer. If the oscillation time ($t_{ON}$) and the non-oscillation time ($t_{OFF}$) are both 10 $\mu$s, one period will be 20 $\mu$s and the oscillation frequency will be 50 kHz. Thus, in order to improve the quality of an interface, the same point can be irradiated for about 60 ms or longer with the oscillation frequency of 50 kHz because of 20 $\mu$s×3,000=60 ms.

A carbon dioxide laser with a power of about 4 kW is currently available in the market. When this laser is oscillated at 50 kHz, the energy per irradiation will be 80 mJ, and the area of 0.4 cm$^2$ can be irradiated at the energy density of 200 mJ·cm$^{-2}$ under the above-noted irradiation conditions. The area of 0.4 cm$^2$ is equivalent to a strip-form area of 0.1 mm in width and 400 mm in length. In consideration of irradiating infrared light to a large glass substrate of 400 mm×500 mm, a strip-form irradiation area is scanned in the longitudinal direction of the substrate (the longitudinal direction of the substrate matching to the width direction of the irradiation area). In order to irradiate the same point on the substrate 3,000 times, the irradiation area should shift to the width (0.1 mm) direction of the strip-form irradiation area by 3.33×10$^{-5}$ mm per irradiation. Since the oscillation frequency is 50 kHz, the irradiation area has the scanning speed of 1.67 mm/s. In other words, the irradiation time in the longitudinal direction of 500 mm is about 300 seconds and is sufficiently practical.

Second Embodiment

FIGS. 5(a)–(d) are figures showing, in cross section, the manufacturing process of a thin film semiconductor device for fabricating MOS field-effect transistors. In the Second Embodiment, a popular non-alkali glass having a strain point of about 650° C. is used as a substrate 501.

First, a first silicon oxide film is deposited at about 200 nm by a ECR-PECVD method on the substrate 501, thus preparing an underlying layer-protecting film 502. The deposition conditions of the first silicon oxide film by the ECR-PECVD method are as follows:

Monosilane (SiH$_4$) flow rate: 60 sccm;
Oxygen (O$_2$) flow rate: 100 sccm;
Pressure: 2.40 m Torr;
Microwave (2.45 GHz) power: 2,250 W;
Applied magnetic field: 875 Gauss;
Substrate temperature: 100° C.; and
Film-forming time: 40 seconds.

On this underlying layer-protecting film, an intrinsic amorphous silicon film is deposited at the film thickness of about 50 nm by an LPCVD method as a semiconductor film. The LPCVD device is a hot wall type and its volume is 184.5l, and the total area of reaction after the insertion of the substrate is about 44,000 cm$^{-2}$. The deposition temperature is 425° C.; disilane (Si$_2$H$_6$) at the purity of 99.99% or above is used as material gas and is supplied to a reactor at 200 sccm. The deposition pressure is about 1.1 Torr, and the deposition rate of the silicon film under this condition is 0.77 nm/min. A krypton-fluorine (KrF) excimer laser is irradiated onto the amorphous semiconductor film prepared thereby, thus crystallizing the semiconductor film. The irradiation laser energy density is 245 mJ·cm$^{-2}$, which is an energy density lower than the appropriate level by 15 mJ·cm$^{-2}$. After forming the crystalline semiconductor film (polycrystalline silicon film) thereby, this crystalline semiconductor film is formed into island pattern and an island 503 of the semiconductor film as an active layer of the semiconductor device is then formed (FIG. 5-a).

Next, a second silicon oxide film 504 is formed by an ECR-PECVD method so as to cover the patterned island 503 of the semiconductor film. This second silicon oxide film functions as a gate insulating film of the semiconductor device. The deposition conditions of the second silicon oxide film are the same as those of the first silicon oxide film, except that the deposition time is shortened to 24 seconds. Right before the deposition of the second silicon oxide film, oxygen plasma is irradiated to the substrate inside the ECR-PECVD to grow a low temperature plasma oxide on the surface of the semiconductor. Plasma oxidation conditions are as follows:

Oxygen ($O_2$) flow rate: 100 sccm;

Pressure: 1.85 m Torr;

Microwave (2.45 GHz) power: 2,000 W;

Applied magnetic field: 875 Gauss;

Substrate temperature: 100° C.; and

Processing time: 24 seconds.

The oxide film of about 3.5 nm is formed on the surface of the semiconductor by plasma oxidation. After oxygen plasma irradiation, an oxide film is continuously deposited while maintaining vacuum. Therefore, the second silicon oxide film consists of the plasma oxide film and the vapor deposition film. The total film thickness is 122.5 nm.

After the second silicon. oxide film is formed, a carbon dioxide laser beam is irradiated onto these thin films in an air ambient as the infrared light irradiation step. The carbon dioxide laser irradiation area is circular. At the center of the circle, the laser energy density is at maximum; and the energy density decreases outward in the characteristics of normal distribution function. The diameter of a circle with the energy density of 1/e (wherein e is a natural logarithm: e=2.71828) relative to the maximum energy density at the center is 4.5 mm. Since the maximum energy density at the center is 630 mJ·cm$^{-2}$, the energy density on the circumference of 4.5 mm in diameter will be 232 mJ·cm$^{-2}$. The oscillation time ($t_{ON}$) and the non-oscillation time ($t_{OFF}$) of the carbon dioxide laser are both 60 μs, so that the oscillation frequency is 8.333 kHz. The irradiation area targeting the circle is shifted by 0.1 mm per irradiation, and the same point on the silicon oxide film receives forty-five times carbon dioxide laser irradiation of 232 mJ·cm$^{-2}$ or above.

After the carbon dioxide laser irradiation, hydrogen plasma irradiation is carried out on the substrate so as to terminate dangling bonds in the polycrystalline semiconductor film and an interface with hydrogen. Hydrogen plasma conditions are as follows:

Hydrogen ($H_2$) flow rate: 1,000 sccm;

Pressure: 500 m Torr;

rf wave (13.56 MHz) power: 100 W;

Distance between electrodes: 25 mm;

Substrate temperature: 300° C.; and

Processing time: 90 seconds.

As a result, the gate insulating film is deposited and the oxide film is improved (FIG. 5-b).

Continuously, a gate electrode 505 is formed from a metal thin film. In the Second Embodiment, a gate electrode is formed from tantalum (Ta) of α structure having a film thickness of 750 nm. The sheet resistance of this gate electrode is 0.8 Ω/□.

Next, with the gate electrode as a mask, impurity ions 506 of donors or acceptors are introduced, thus forming self-aligned source-drain region 507 and channel formation region 508 to the gate electrode. A CMOS semiconductor device was formed in the Second Embodiment. In preparing an NMOS transistor, while a PMOS transistor section is covered with an aluminum (Al) thin film, phosphine ($PH_3$) diluted at 5% concentration in hydrogen as an impurity element is selected and full ions containing hydrogen were introduced by the accelerating voltage of 80 kV to the source-drain region of the NMOS transistor at the concentration of 7×10$^{15}$ cm$^{-2}$. On the other hand, in preparing a PMOS transistor, while an NMOS transistor section is covered with an aluminum (Al) thin film, diborane ($B_2H_6$) diluted at 5% concentration in hydrogen as an impurity element is selected and full ions containing hydrogen were introduced by the accelerating voltage of 80 kV to the source-drain region of the PMOS transistor at the concentration of 5×10$^{15}$ cm$^{-2}$ (FIG. 5-c).

Then, an inter-layer insulating film 509 is deposited by a PECVD method or the like. The inter-layer insulating film includes a silicon dioxide film, and the film thickness is about 500 nm. After the deposition of the inter-layer insulating film, a heat treatment is carried out for two hours at 300° C. under the nitrogen atmosphere, for both the densification of the inter-layer insulating film and the activation of impurity elements added to the source-drain region.

Finally, contact holes were opened and wiring 510 such as aluminum is provided, thus completing a thin film semiconductor device (FIG. 5-d).

The transfer characteristics of the thin film semiconductor device prepared thereby were measured. The measured length and width of a channel formation region of the semiconductor device were 10 μm each respectively, and the measurement was carried out at room temperature. The mobility of the NMOS transistor calculated from the saturation current at Vds=8V was 42.4±1.9 cm$^2$·V$^{-1}$·s$^{-1}$, and the threshold voltage was 3.87±0.11V. Also, the mobility of the PMOS transistor calculated from the saturation current at Vds=−8V was 21.8±1.2 cm$^2$·V$^{-1}$·s$^{-1}$, and the threshold voltage was −5.33±0.21V. Both the N type and P type semiconductor devices were manufactured with stability, being good thin film semiconductor devices with high mobility and low threshold voltage with no fluctuation. As shown in this example, according to the present invention, thin film semiconductor devices with excellent characteristics and also with a highly reliable oxide film can be simply and easily fabricated by the low temperature step where a popular glass substrate can be used.

COMPARATIVE EXAMPLE 1

Comparative Example 1 is an example to demonstrate that the present invention is superior to prior arts. In Comparative Example 1, a semiconductor device is fabricated with all the steps which are the same as in the Second Embodiment, except that the light irradiation step is omitted. In other words, after the second silicon oxide film was deposited by an ECR-PECVD method, the above-noted hydrogen plasma irradiation was carried out right away, and a CMOS semiconductor device was manufactured thereafter in the same steps as in the Second Embodiment.

The mobility and threshold voltage of the semiconductor device obtained in Comparative Example 1 are shown below:

$\mu(N)=34.4\pm3.3$ cm$^2$·V$^{-1}$·s$^{-1}$;

$V_{th}(N)=5.06\pm0.16$V;

$\mu(P)=16.2\pm1.2$ cm$^2$·V$^{-1}$·s$^{-1}$; and $V_{th}(P)=-6.30\pm0.22$V.

According to this Comparative Example 1, the Second Embodiment of the present invention is clearly superior.

Third Embodiment

Using the NMOS thin film semiconductor device obtained in the Second Embodiment as a switching element for picture elements of a color LCD having 200 (row)×320 (column)×3(color)=192,000 (picture elements), an active matrix substrate was manufactured wherein a 6-bit digital data driver (column side driver) and a scanning driver (row side driver) were built-in the CMOS thin film semiconductor device obtained in the Second Embodiment.

Figure 6:
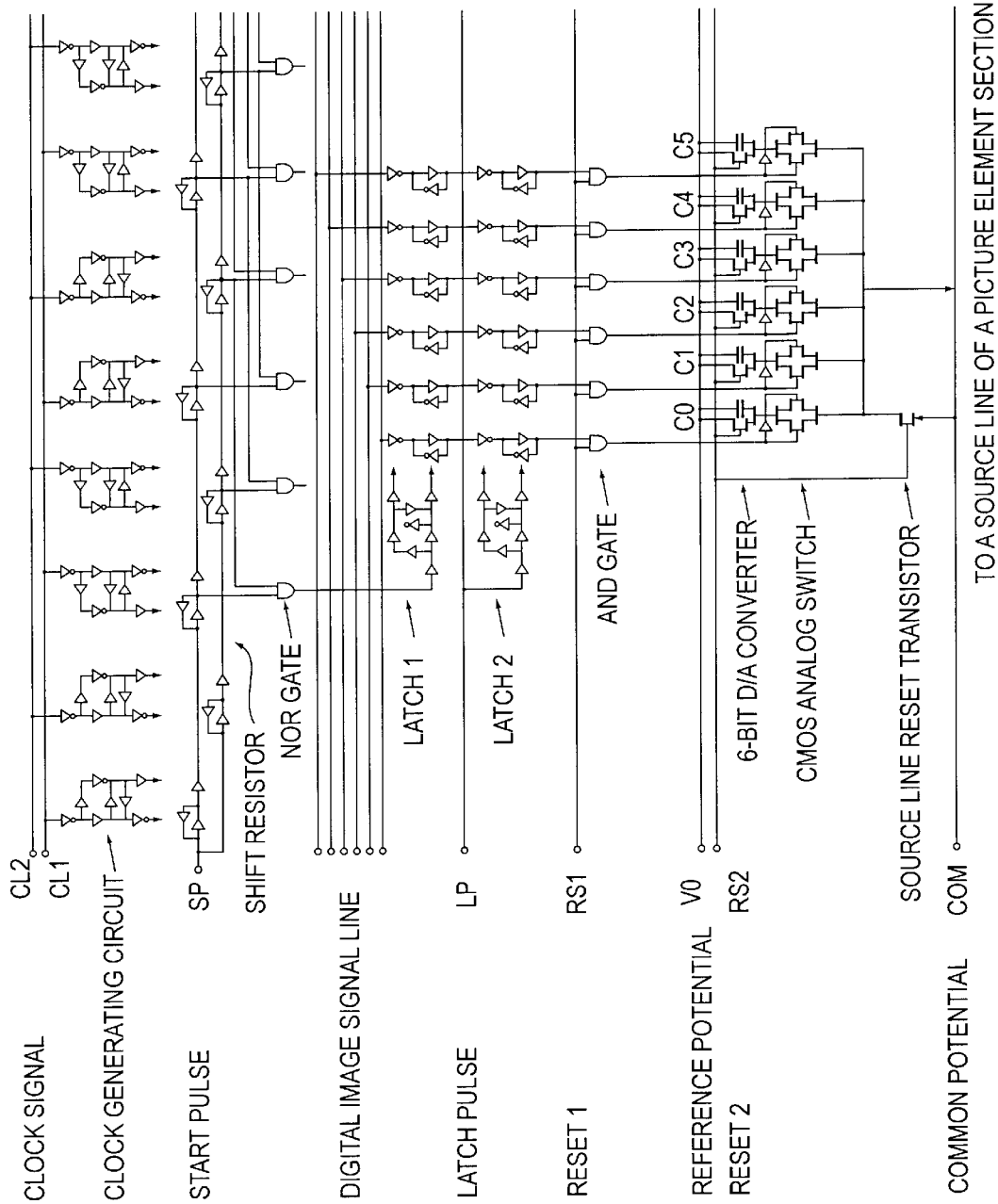
FIG. 6 is a figure explaining a display device of the present invention.
Figure 7:
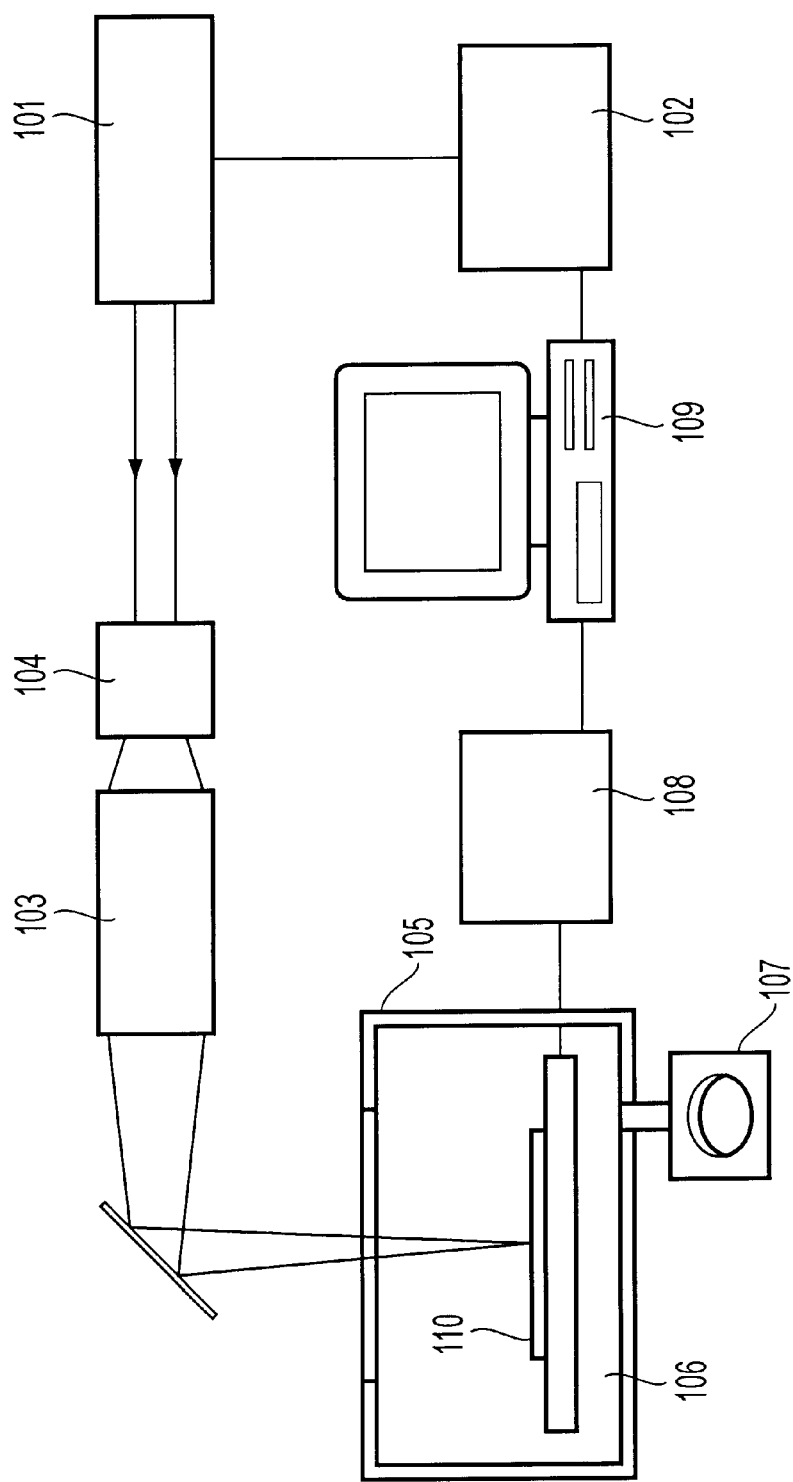
FIG. 7 is a figure explaining an infrared light irradiating device of the present invention.

FIG. 6 is a circuit diagram of the 6-bit digital data driver. The digital data driver of the Third Embodiment includes a clock signal line and a clock generating circuit, a shift resistor circuit, a NOR gate, a digital image signal line, a latch circuit 1, a latch pulse line, a latch circuit 2, a reset line 1, an AND gate, a reference potential line, a reset line 2, a 6-bit D/A converter by capacitance split, a CMOS analog switch, a common potential line and a source line reset-transistor. The output from the CMOS analog switch is connected to the source line of the picture element section. The capacitance of the D/A converter section satisfies the relations: $C_0=C_1/2=C_2/4=C_3/8=C_4/16=C_5/32$. Digital image signals output from the video random access memory (VRAM) of a computer can be directly input to the digital image signal line. The picture elements of the active matrix substrate of the Third Embodiment include source electrodes and source wiring, and the drain electrodes (picture element electrodes) include aluminum, forming a reflective LCD.

A liquid crystal panel is manufactured wherein the active matrix substrate obtained thereby is used for one of a pair of substrates. For a liquid crystal sandwiched between the pair of substrates, a polymer dispersion liquid crystal (PDLC) wherein black pigment was dispersed is applied, and is used as a reflective liquid crystal panel of the normally black mode (black display when voltage is not applied to liquid crystals). The prepared liquid crystal panel is connected to external wiring, thus manufacturing a liquid crystal display device.

As a result, since the TFT is of high quality and the characteristics are also even over the entire substrate surface, the 6-bit digital data driver and the scanning driver operate normally at the wide operation area; and moreover, since the aperture ratio is high regarding the picture element section, a liquid crystal display device of high display quality is fabricated even with the black pigment dispersion PDLC. In addition, the interface condition between the semiconductor film and the oxide film is good, and the quality of the oxide film itself is high, so that operational reliability of the transistor is excellent and thus operational stability of the display device becomes much superior.

This liquid crystal display device is built into the body of a full-color portable personal computer (notebook PC). The 6-bit digital data driver is built in an active matrix substrate, and the digital image signals from the computer are directly input to the liquid crystal display device, so that the circuit structure becomes simple and, at the same time, power consumption becomes extremely small. Since the thin film semiconductor device used for the liquid crystal display device performs well, this notebook PC is a preferable electronic apparatus with an extremely attractive display screen. In addition, the liquid crystal display device—being the reflection type with a high aperture ratio—requires no back light, achieving miniaturization and weight-lightening and long-time battery use. As a result, an ultra-small light weight electronic apparatus with an attractive display screen is fabricated that can be used for a long period.

Fourth Embodiment

In the Fourth Embodiment, an infrared light irradiating device for improving the quality of a silicon oxide film formed on a substrate by irradiating infrared light will be explained by referring to FIG. 7 to FIG. 11. The infrared light irradiating device for improving the quality of a silicon oxide film has at least an infrared light generating means consisting of a carbon dioxide laser oscillator 101 and the like, an infrared light intensity controlling means for controlling the absolute intensity of the infrared light generated thereby, an infrared light leveling means for leveling the spatial intensity distribution of intensity controlled infrared light, and a scanning mechanism that can vary the relative positional relations between the substrate formed with the silicon oxide film and this leveled infrared light. (See FIG. 7.)

The infrared laser beams generated by the carbon dioxide laser oscillator 101 are controlled at the preferable absolute intensity thereof by an optical system 104 consisting of an attenuator and the like. In the Fourth Embodiment, this optical system 104 is equivalent to the infrared light intensity controlling means. More specifically, by changing the transmissivity of the infrared laser beams entering the optical system 104, the output strength thereof is made variable. Then, the intensity controlled infrared light is directed by the infrared light leveling means consisting of a homogenizer 103 and the like, and the spatial intensity distribution of the infrared light will be leveled without generating major spatial fluctuations within the infrared light irradiation area on the substrate. The formed infrared light thereby is introduced to an irradiation chamber 105, and infrared light is irradiated to the substrate 110 in the irradiation chamber.

In order to have the irradiation atmosphere of infrared light be of a predetermined atmosphere such as in vacuum, in nitrogen, in argon or the like, the irradiation chamber is equipped with an exhaust means including a pump 107 and the like and a gas introducing means including a gas system 106, etc. The relative positional relations between the infrared light introduced to the irradiation chamber and the substrate 110 formed with a silicon oxide film become variable by shifting the stage where the substrate is placed thereon by a stage controller 108. In other words, in the Fourth Embodiment, the scanning mechanism shifts the substrate with a fixed infrared light path. As mentioned in the following embodiment, the scanning mechanism where an infrared light path is shifted while fixing a substrate and the scanning mechanism where both are shifted are clearly possible. Moreover, a computer 109 is a control system so as to control the stage controller 108 and a laser controller 102.

In order to improve the film quality of a silicon oxide film formed by a vapor growth method or the like by heating the entire film once, an infrared laser beam oscillator with an extremely large output is necessary. A laser oscillator of such a large output is not yet existent. Thus, in the present invention, infrared light is arranged to be a strip-form irradiation area or a fine line type irradiation area by the infrared light leveling means, and uniform light irradiation is made possible over the entire substrate by making this irradiation area mobile by the above-mentioned scanning mechanism. The laser beam intensity in the irradiation area is preferably uniform. The infrared light leveling means of the present invention will now be explained.

Figure 8:
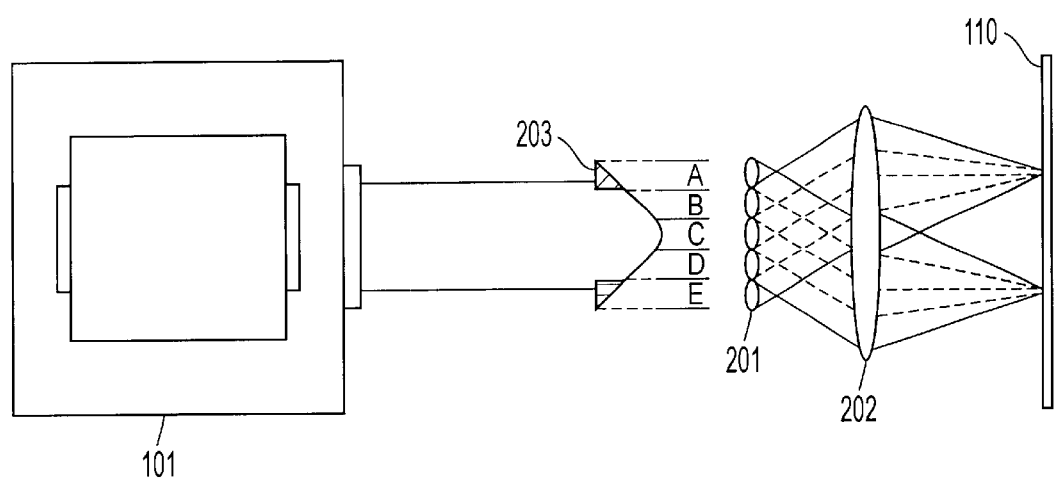
FIG. 8 is a figure explaining an infrared light irradiating device with a fly eye lens of the present invention.
Figure 9:
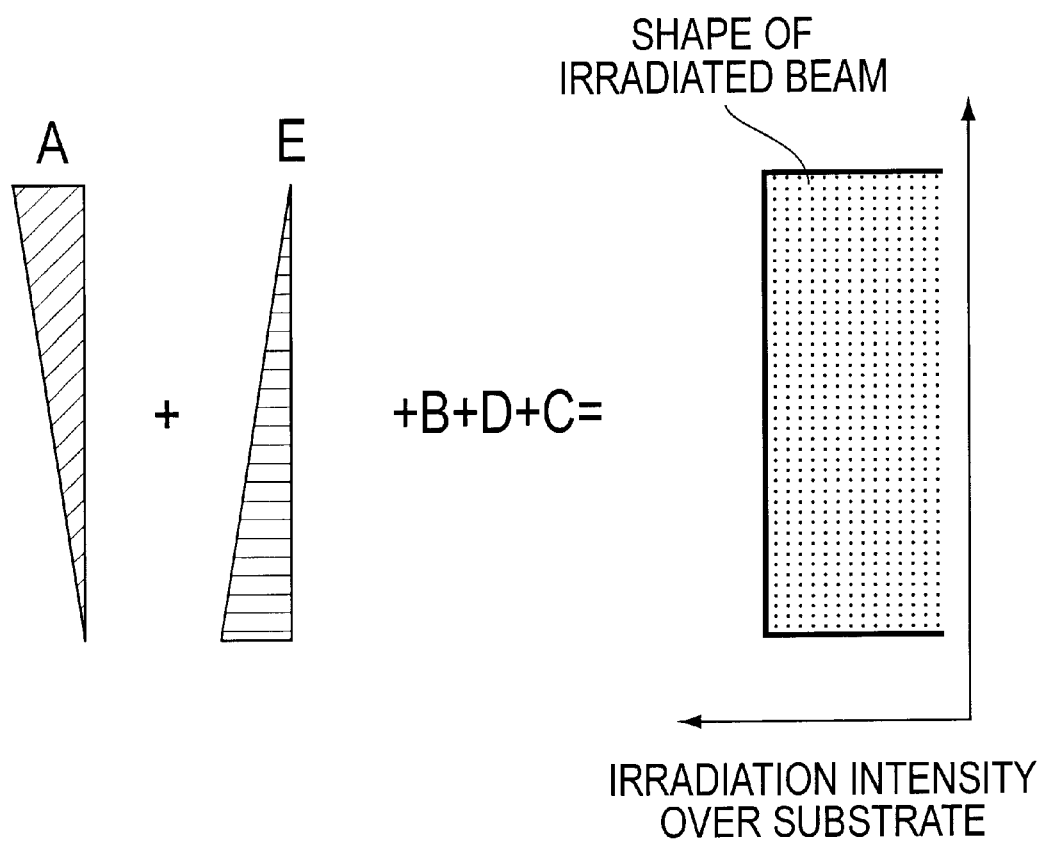
FIG. 9 is a figure showing the principle of leveling an infrared light intensity distribution with the application of a fly eye lens.

FIG. 8 shows an example of infrared light leveling means using a fly eye lens 201. This infrared light leveling means has a fly eye lens 201 and a condenser lens 202 as fundamental constructional elements, and a cylindrical lens is used as the condenser lens 202. Numerical reference 203 is an incident infrared laser beam. The laser beam 203 incident on the fly eye lens 201 has its wave front divided by a so-called fly eye lens where a plurality—five (from A to E) in FIG. 8—of square or cylindrical lenses are bundled in a cross section perpendicular to an optical axis. After the divided laser beams are condensed at the focal point of the above-noted fly eye lens, they enter the condenser lens 202 having the same focal point as the above-noted fly eye lens; and this condenser lens forms a uniform laser beam by again overlapping each divided laser beam at the focal point on the image side—in other words, on the substrate. FIG. 9 shows the intensity distribution of the laser beams divided into A to E on the substrate 110 and the intensity distribution of laser beams after the overlap of these beams. In this method, among the divided laser beams, the ones that are symmetrical to each other relative to an optical axis such as A and E, and B and D in FIG. 9 have symmetrical strength distributions, so that uniformity is achieved by overlapping these with each other.

Figure 10:
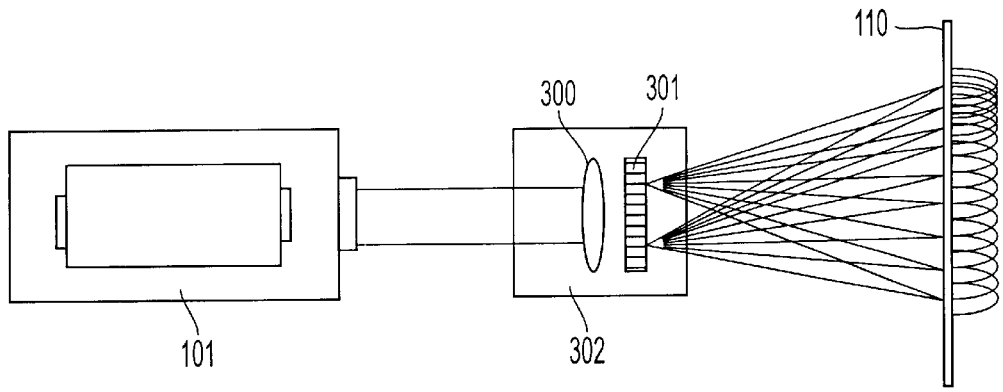
FIG. 10 is a figure explaining an infrared light irradiating device with a Fourier-transform phase hologram of the present invention.
Figure 11:
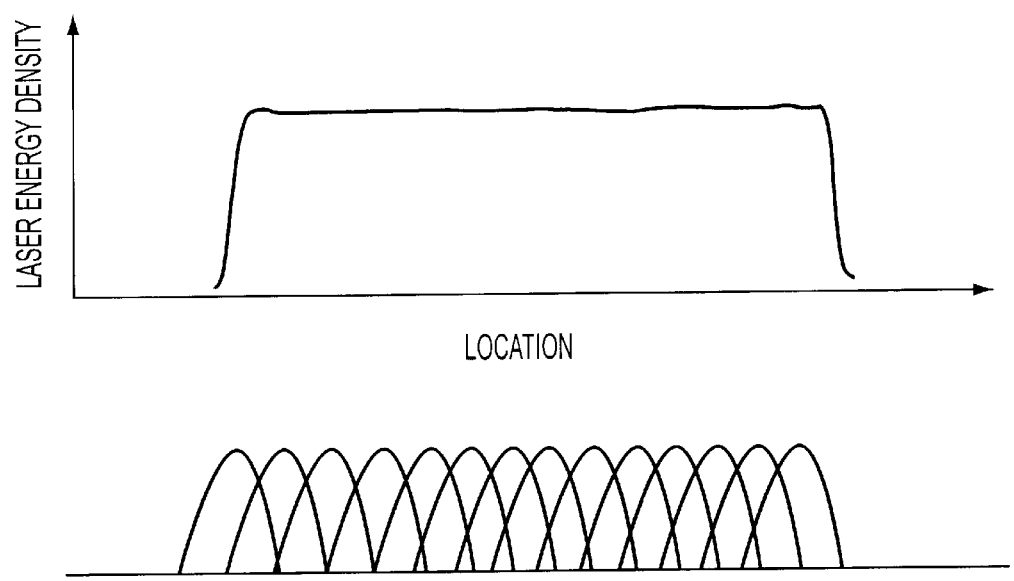
FIG. 11 is a figure showing the principle of leveling an infrared light intensity distribution with the application of a Fourier-transform phase hologram.

FIG. 10 shows an example of an infrared light leveling means using a Fourier-transform phase hologram 301. The infrared light leveling means herein has a lens 300 and the Fourier-transform phase hologram 301 (abbreviated as hologram hereinafter) as basic structural elements. The lens 300 and the hologram 301 create fine line laser beams having a uniform laser strength distribution in the longitudinal direction on the substrate 110 formed with a silicon oxide film as a target for processing. The laser beams from the laser oscillator 101 pass through a beam shaping optical system 302 consisting of the lens 300 and the hologram 301. In this case, the laser beams are irradiated on the substrate 110 by the lens 300, but are spatially modulated so as to have a plurality of overlapping irradiation spots in one direct line on the substrate 110 by the hologram 301 between the lens 300 and the substrate 110. The hologram 301 can arrange each irradiation spot at an optional location on the substrate 110 by optional strength. FIG. 11 is a figure showing the shape of a laser beam shaped by the laser beam shaping optical system in FIG. 10 and irradiated to the substrate formed with a silicon oxide film. As shown in FIG. 11, the hologram 301 is used so as to line up the irradiation spots in one straight line and pitches are made uniform by overlapping the irradiation spots, thus providing laser beams that are uniform in the longitudinal direction on the substrate 110. The hologram 301 divides laser beams into 400 to 800 irradiation spots, leveling the strength distribution of the laser beams.

Fifth Embodiment

The Fifth Embodiment explains an infrared light irradiating device for improving the quality of a silicon oxide film that makes the quality improvement of the silicon oxide film formed on a substrate possible by infrared light irradiation. This infrared light irradiating device has at least an infrared light generating means including a carbon dioxide laser oscillator 101 and the like, a light shaping means for shaping the infrared light generated thereby into a spot shape, and a scanning mechanism which makes the relative positional relations between the substrate formed with the silicon oxide film and the infrared light shaped into this spot shape variable.

Figure 12:
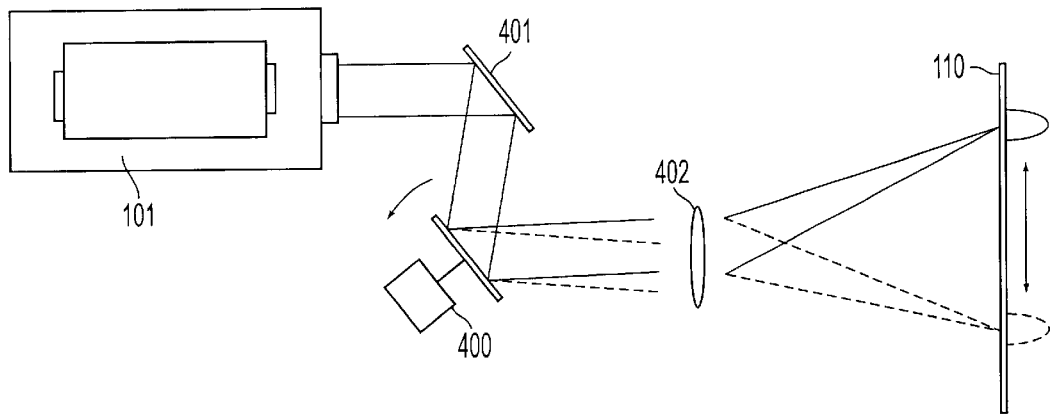
FIG. 12 is a figure explaining an infrared light-irradiating device with a galvano-scanner of the present invention.

The infrared laser beams generated by the carbon dioxide laser oscillator 101 are guided to a mirror 400 of a galvano-scanner, one type of a scanning mechanism, by a mirror 401 (FIG. 12). After the laser beams are reflected by the mirror 400 of the galvano-scanner, they enter a lens 402 and are then shaped into spot-shaped beams. In the Fifth Embodiment, this lens 402 corresponds to the light shaping means for shaping into the spot shape. The shaped infrared light thereby is introduced to an irradiation chamber 105, irradiating light to a substrate 110 placed in the irradiation chamber. The structure and the control system of the irradiation chamber are the same as the ones in the Fourth Embodiment. In the fifth Embodiment, by changing the angles of the mirror 400 of the galvano-scanner, the position of the laser beams irradiated on the substrate 110 is changed. This irradiated light is scanned in a line shape or a surface shape, irradiating infrared laser beams over the entire surface of the substrate 110. The irradiated laser beams are absorbed by the silicon oxide film formed on the substrate, heating the silicon oxide film. As a result, the quality of the oxide film is improved.

Figure 13:
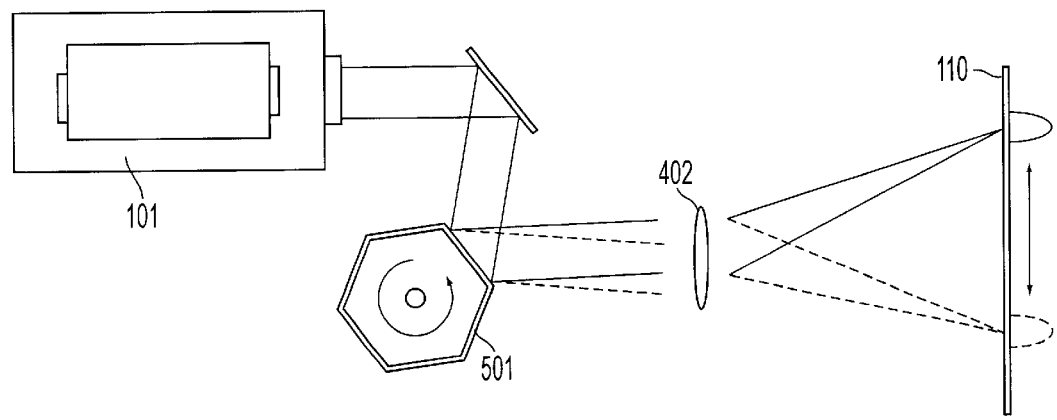
FIG. 13 is a figure explaining an infrared light-irradiating device with a polygon mirror of the present invention.

On the other hand, FIG. 13 is another example of a light irradiating device using a polygon mirror 601 as a scanning mechanism. The laser beams irradiated from the laser oscillator 101 are reflected at the polygon mirror 601, and enter the lens 402. After the infrared light is shaped into a spot shape by the lens 402, it is guided to the irradiation chamber, irradiating the substrate 110. In the scanning mechanism of this example, by changing the angle of the polygon mirror 601, the location of laser irradiation on the substrate 110 is changed. As the example mentioned above, laser beams scan over the entire surface of the substrate thereafter, promoting the quality improvement of the silicon oxide film.

These embodiments showed the case where carbon dioxide laser beams are used as infrared light; however, a IV–VI group semiconductor laser, free electron laser, etc. may be used as infrared light.

INDUSTRIAL APPLICABILITY

As described above, according to the present invention, conventional silicon oxide films of low quality formed at low temperature can be improved to a film of high quality by adding an infrared light irradiation step. Thus, as the present invention is applied to a thin-film semiconductor device such as a TFT and a semiconductor device such as LSI, a semiconductor device of superior operational reliability and high performance can be manufactured at low temperature with stability. Also, when the present invention is adopted to an active matrix liquid crystal display device, a large and attractive display device can be easily manufactured with stability. Moreover, as the present invention is applied to other electronic apparatuses, electronic apparatuses of high performance can be easily manufactured with stability.

Furthermore, the infrared light irradiating device of the present invention can process a large substrate at high speed and with stability, and is suitable for treating TFT substrates, large silicon substrates of 300 mm in diameter and the like.

What is claimed is:

1. A method for manufacturing a silicon oxide film comprising:
    forming a silicon oxide film by vapor deposition; and
    irradiating infrared light onto the silicon oxide film,
    wherein the wavelength of said infrared light is between about 8.9 $\mu$m and 10.0 $\mu$m.

2. The method of claim 1, the vapor deposition method being a chemical vapor deposition method.

3. The method of claim 1, the vapor deposition method being a physical vapor deposition method.

4. The method of claim 1, the infrared light being a laser beam.

5. The method of claim 1, the infrared light being a carbon dioxide ($CO_2$) laser beam.

6. A method for manufacturing a semiconductor device comprising:
    oxidizing a semiconductor surface to form a silicon oxide film on the semiconductor surface; and irradiating infrared light onto the silicon oxide film, wherein the wavelength of said infrared light is between about 8.9 µm and 10.0 µm.

7. The method of claim 6, forming the silicon oxide film being carried out under a temperature of around 800° C. or below.

8. The method of claim 6, forming the silicon oxide film comprising supplying active oxygen to the semiconductor surface.

9. The method of claim 6, forming the silicon oxide film comprising plasma-oxidizing the semiconductor surface.

10. The method of claim 6, the infrared light being a laser beam.

11. The method of claim 6, the infrared light being a carbon dioxide ($CO_2$) laser beam.

12. A method for manufacturing a semiconductor device comprising:

forming a semiconductor film on an insulating material;

forming a silicon oxide film on the semiconductor film; and irradiating infrared light onto the silicon oxide film, wherein the wavelength of said infrared light is between about 8.9 µm and 10.0 µm.

13. A method of manufacturing a semiconductor device comprising:

forming a semiconductor film on an insulating material;

forming a silicon oxide film on the semiconductor film; and irradiating infrared light onto the silicon oxide film, wherein the wavelength of said infrared light is between about 8.9 µm and 10.0 µm.

14. The method of claim 13, the step of forming a silicon oxide film being carried out by a chemical vapor deposition method.

15. The method of claim 13, the step of forming a silicon oxide film being carried out by a physical vapor deposition method.

16. The method of claim 13, the step of forming a silicon oxide film being carried out at a temperature about 600° C. or below.

17. The method of claim 13, the step of forming a silicon oxide film comprising supplying oxygen to the semiconductor surface.

18. The method of claim 13, the step of forming a silicon oxide film comprising plasma-oxidizing the semiconductor surface.

19. The method of claim 13, the infrared light being a laser beam.

20. The method of claim 13, the infrared light being a carbon dioxide ($CO_2$) laser beam.

21. The method of claim 13, the step of irradiating infrared light being carried out in inactive gas atmosphere.

22. The method of claim 13, further comprising terminating dangling bonds after the step of irradiating infrared light.

23. The method of claim 12, the insulating material being a silicon oxide film formed on a glass substrate.

24. A semiconductor device manufactured by the method of claims 13.

25. A display device comprising a semiconductor device manufactured by the method of claim 13.

26. A method for manufacturing a display device, comprising a step of manufacturing a semiconductor device according to a method of claim 13.

* * * * *